(12) United States Patent
Kajihara

(10) Patent No.: US 11,041,980 B2
(45) Date of Patent: Jun. 22, 2021

(54) SOLID-STATE IMAGING ELEMENT, MANUFACTURING METHOD, AND ELECTRONIC DEVICE

(71) Applicant: SONY SEMICONDUCTOR SOLUTIONS CORPORATION, Kanagawa (JP)

(72) Inventor: Kenichi Kajihara, Kagoshima (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 30 days.

(21) Appl. No.: 15/753,415

(22) PCT Filed: Aug. 24, 2016

(86) PCT No.: PCT/JP2016/074580
§ 371 (c)(1),
(2) Date: Feb. 19, 2018

(87) PCT Pub. No.: WO2017/043308
PCT Pub. Date: Mar. 16, 2017

(65) Prior Publication Data
US 2018/0240829 A1    Aug. 23, 2018

(30) Foreign Application Priority Data
Sep. 7, 2015    (JP) .............................. JP2015-175387

(51) Int. Cl.
*H01L 27/146* (2006.01)
*G02B 5/20* (2006.01)
*H04N 9/04* (2006.01)

(52) U.S. Cl.
CPC .......... *G02B 5/20* (2013.01); *H01L 27/14621* (2013.01); *H01L 27/14627* (2013.01);
(Continued)

(58) Field of Classification Search
CPC ......... H01L 27/14621; H01L 27/14687; H01L 27/14632; H01L 27/14685;
(Continued)

(56) References Cited

U.S. PATENT DOCUMENTS 5,321,297 A * 6/1994 Enomoto .......... H01L 27/14627
257/432
5,592,223 A * 1/1997 Takamura .......... H01L 27/14621
257/E27.159
(Continued)

FOREIGN PATENT DOCUMENTS

CN    1838419 A    9/2006
CN    102246301 A    11/2011
(Continued)

OTHER PUBLICATIONS

International Search Report and Written Opinion of PCT Application No. PCT/JP2016/074580, dated Nov. 8, 2016, 09 pages.
(Continued)

*Primary Examiner* — Hoang-Quan Ho
(74) *Attorney, Agent, or Firm* — Chip Law Group

(57) ABSTRACT

The present disclosure relates to a solid-state imaging element, a manufacturing method, and an electronic device capable of further improving quality. A flattening film is formed so as to fill a recessed portion of a semiconductor substrate having a pixel region in which a plurality of pixels is arranged in an array, a recessed region is formed in the flattening film by hollowing out a region corresponding to the pixel region, and a color filter layer is formed in the recessed region. In addition, an on-chip lens layer is formed on a plane including the flattening film and the color filter layer. The present technology is applicable, for example, to a CMOS image sensor.

9 Claims, 10 Drawing Sheets

(52) U.S. Cl.
CPC .. *H01L 27/14632* (2013.01); *H01L 27/14645* (2013.01); *H01L 27/14685* (2013.01); *H01L 27/14687* (2013.01); *H04N 9/045* (2013.01)

(58) Field of Classification Search
CPC ........ H01L 27/14627; H01L 27/14645; G02B 5/20; H04N 9/045
See application file for complete search history.

(56) References Cited

U.S. PATENT DOCUMENTS

| | | | | |
|---|---|---|---|---|
| 5,739,548 | A * | 4/1998 | Shigeta | H01L 27/14627 257/432 |
| 6,582,988 | B1 * | 6/2003 | Hsiao | G02B 3/0018 257/E31.128 |
| 2005/0101049 | A1 * | 5/2005 | Kim | H01L 27/14685 438/66 |
| 2006/0214195 | A1 | 9/2006 | Kobayashi et al. | |
| 2006/0292731 | A1 * | 12/2006 | Kim | H01L 27/14621 438/57 |
| 2007/0010042 | A1 * | 1/2007 | Li | H01L 27/14685 438/70 |
| 2007/0145426 | A1 * | 6/2007 | Kim | H01L 27/14632 257/234 |
| 2007/0158772 | A1 * | 7/2007 | Boettiger | H01L 27/14621 257/432 |
| 2008/0283949 | A1 * | 11/2008 | Park | H01L 27/14627 257/432 |
| 2009/0170233 | A1 * | 7/2009 | Yun | H01L 27/14632 438/65 |
| 2010/0149396 | A1 | 6/2010 | Summa et al. | |
| 2013/0010165 | A1 * | 1/2013 | Yu | H01L 27/14618 348/273 |
| 2017/0040357 | A1 * | 2/2017 | Yu | H01L 27/14621 |
| 2017/0062496 | A1 * | 3/2017 | Lai | H01L 27/1463 |

FOREIGN PATENT DOCUMENTS

| | | |
|---|---|---|
| EP | 1705706 A2 | 9/2006 |
| JP | 61-150268 A | 7/1986 |
| JP | 02-181967 A | 7/1990 |
| JP | 05-021771 A | 1/1993 |
| JP | 10-012853 A | 1/1998 |
| JP | 10-12853 A | 1/1998 |
| JP | 2004-071931 A | 3/2004 |
| JP | 2006-269963 A | 10/2006 |
| JP | 2007-147738 A | 6/2007 |
| JP | 2009-088140 A | 4/2009 |
| JP | 2009-152414 A | 7/2009 |
| JP | 2009-267062 A | 11/2009 |
| JP | 2011-165791 A | 8/2011 |
| KR | 10-2006-0103075 A | 9/2006 |
| TW | 201103129 A | 1/2011 |
| WO | 2010/074708 A1 | 7/2010 |
| WO | WO2015093017 * | 6/2015 |

OTHER PUBLICATIONS

Office Action for JP Patent Application No. 2017-539099, dated Sep. 15, 2020, 03 pages of Office Action and 03 pages of English Translation.

* cited by examiner

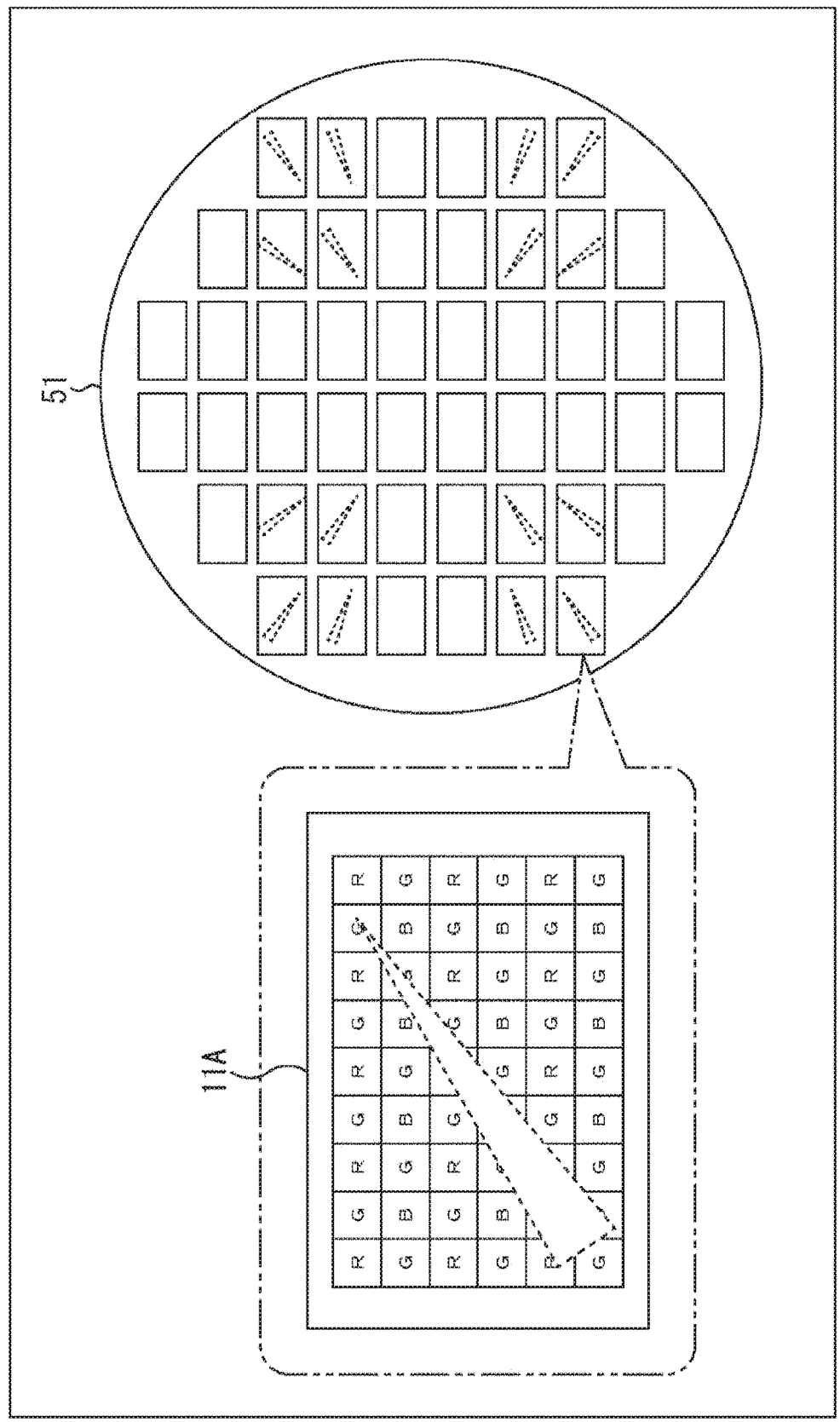

FIG. 6
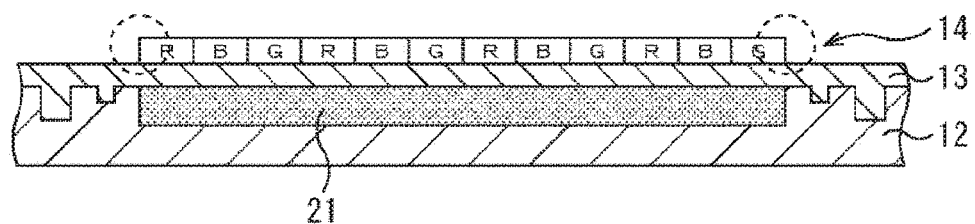
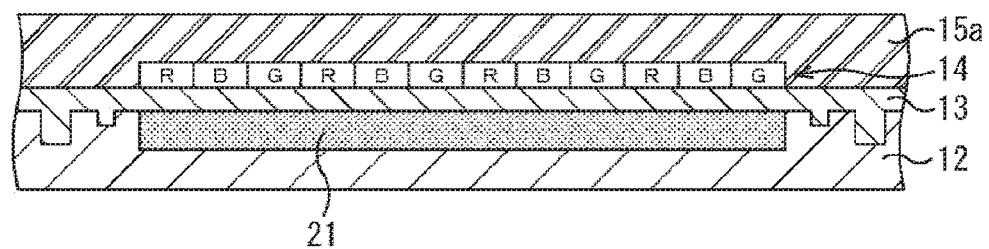

SOLID-STATE IMAGING ELEMENT, MANUFACTURING METHOD, AND ELECTRONIC DEVICE

CROSS REFERENCE TO RELATED APPLICATIONS

This application is a U.S. National Phase of International Patent Application No. PCT/JP2016/074580 filed on Aug. 24, 2016, which claims priority benefit of Japanese Patent Application No. JP 2015-175387 filed in the Japan Patent Office on Sep. 7, 2015. Each of the above-referenced applications is hereby incorporated herein by reference in its entirety.

TECHNICAL FIELD

The present disclosure relates to a solid-state imaging element, a manufacturing method, and an electronic device, and particularly to a solid-state imaging element, a manufacturing method, and an electronic device capable of further improving quality.

BACKGROUND ART

Generally, a method for manufacturing a solid-state imaging element such as a charge coupled device (CCD) or a complementary metal oxide semiconductor (CMOS) image sensor includes a step of forming various films such as a flattening film on a semiconductor substrate. The step of forming such a film uses a spin coating method capable of uniformly forming a thin film utilizing a centrifugal force generated by rotating a semiconductor substrate at a high speed.

For example, Patent Document 1 discloses a solid-state imaging element capable of improving image quality even using a spin coating method for film formation.

CITATION LIST

Patent Document

Patent Document 1: Japanese Patent Application Laid-Open No. 5-21771

SUMMARY OF THE INVENTION

Problems to be Solved by the Invention

By the way, when a color filter pattern, an on-chip lens, or the like is formed using such a spin coating method as described above, application unevenness is generated due to an influence of a level difference formed so as to protrude from the flattening film, and it is difficult to apply a material uniformly. This may deteriorate quality of the solid-state imaging element, and may also affect image quality.

The present disclosure has been achieved in view of such a situation, and makes it possible to further improve quality.

Solutions to Problems

A solid-state imaging element according to an aspect of the present disclosure includes: a semiconductor substrate having a pixel region in which a plurality of pixels is arranged in an array; a flattening film formed so as to fill a recessed portion of the semiconductor substrate; and a color filter layer formed in a recessed region formed in the flattening film corresponding to the pixel region.

A method for manufacturing a solid-state imaging element according to an aspect of the present disclosure includes: forming a flattening film so as to fill a recessed portion of a semiconductor substrate having a pixel region in which a plurality of pixels is arranged in an array; and forming a color filter layer in a recessed region formed in the flattening film corresponding to the pixel region.

An electronic device according to an aspect of the present disclosure includes a solid-state imaging element including: a semiconductor substrate having a pixel region in which a plurality of pixels is arranged in an array; a flattening film formed so as to fill a recessed portion of the semiconductor substrate; and a color filter layer formed in a recessed region formed in the flattening film corresponding to the pixel region.

In an aspect of the present disclosure, a flattening film is formed so as to fill a recessed portion of a semiconductor substrate having a pixel region in which a plurality of pixels is arranged in an array, and a color filter layer is formed in a recessed region formed in the flattening film corresponding to the pixel region.

Effects of the Invention

According to an aspect of the present disclosure, quality can be further improved.

BRIEF DESCRIPTION OF DRAWINGS

FIG. 5 is a diagram for explaining application unevenness generated in a spin coating method.

FIG. 6 is a diagram for explaining application unevenness generated when a lens material of an on-chip lens layer is applied.

MODE FOR CARRYING OUT THE INVENTION

Hereinafter, a specific embodiment to which the present technology is applied will be described in detail with reference to the drawings.

Configuration Example of Solid-state Imaging Element

Figure 1:
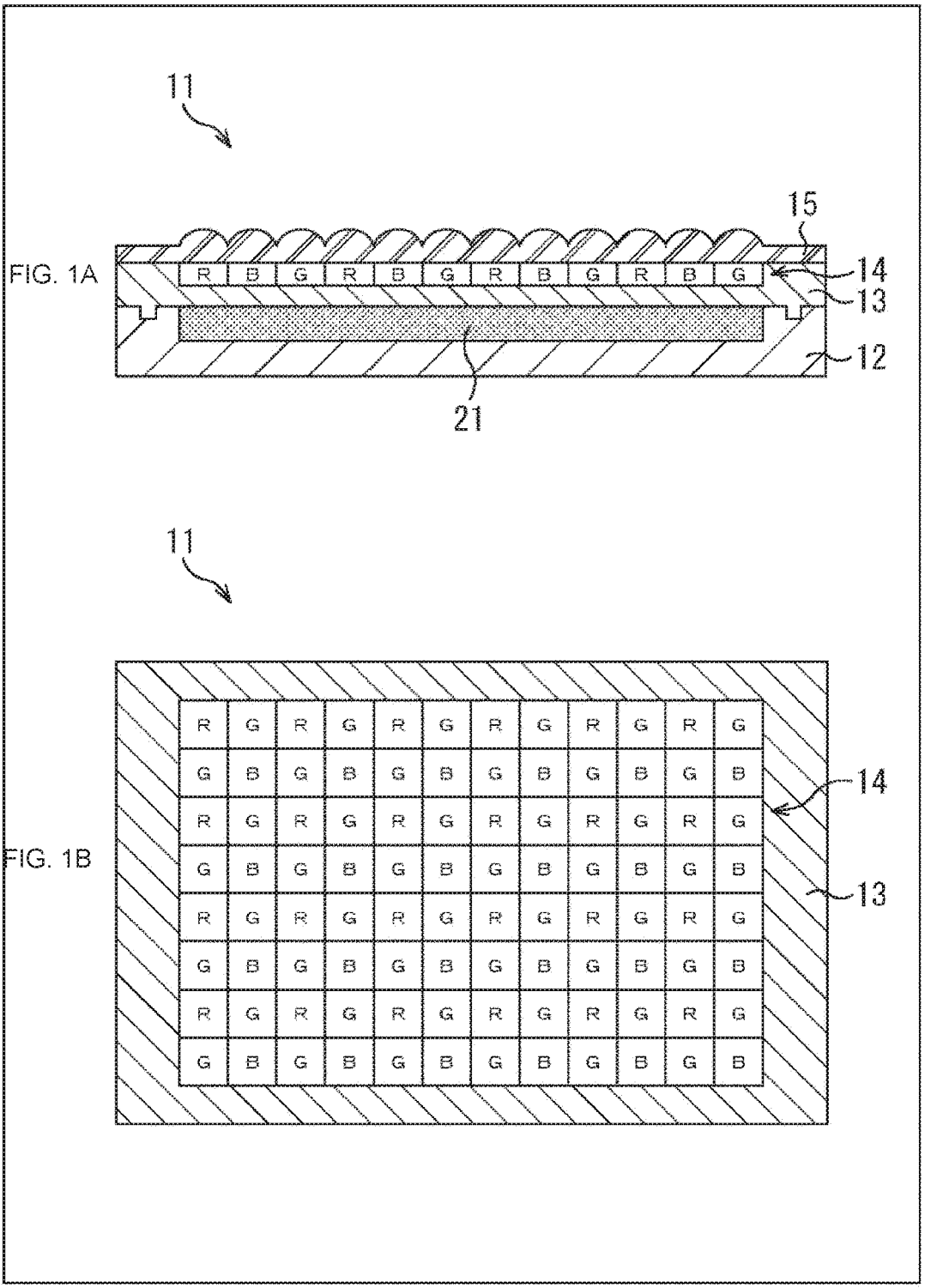
FIGS. 1A and 1B are diagrams illustrating a configuration example of an embodiment of a solid-state imaging element to which the present technology is applied.

FIGS. 1A and 1B are diagrams illustrating a configuration example of an embodiment of a solid-state imaging element to which the present technology is applied. FIG. 1A illustrates a cross-sectional configuration example of a solid-state imaging element. FIG. 1B illustrates a planar configuration of a color filter layer of the solid-state imaging element of FIG. 1A.

As illustrated in FIGS. 1A and 1B, a solid-state imaging element 11 is constituted by laminating a semiconductor substrate 12, a flattening film 13, a color filter layer 14, and an on-chip lens layer 15.

The semiconductor substrate 12 is, for example, a plate-like wafer obtained by slicing single crystal silicon thinly, and a pixel region 21 in which a plurality of pixels is arranged in an array is formed.

The flattening film 13 is formed so as to fill a recessed portion (for example, a scribe line or the like) formed in the semiconductor substrate 12, for example, by applying an organic or inorganic polymer material by a spin coating method, and a surface thereof is flattened.

The color filter layer 14 is constituted by arranging, for each of the plurality of pixels formed in the pixel region 21, a filter for transmitting light of colors (for example, three primary colors of red, blue, and green) received by each of the pixels.

Here, as illustrated in FIG. 1A, in the solid-state imaging element 11, the color filter layer 14 is formed so as to fill a recessed region (recessed region 32 in FIG. 2 described below) formed by recessing a surface of the flattening film 13. In addition, the color filter layer 14 is formed such that a surface thereof is flat with the surface of the flattening film 13.

The on-chip lens layer 15 is constituted by arranging lenses of a small pixel size so as to condense light for each of the plurality of pixels formed in the pixel region 21.

In the solid-state imaging element 11 constituted in this way, the color filter layer 14 fills the recessed region of the flattening film 13, and it is thereby possible to suppress application unevenness generated when the color filter layer 14 is formed. This makes it possible to make the thickness of the color filter layer 14 uniform, and to improve quality of the solid-state imaging element 11. Therefore, it is possible to avoid generation of nonuniformity of brightness for each color of an image imaged by the solid-state imaging element 11 (for each color filter of the color filter layer 14), and to improve image quality.

In addition, in the solid-state imaging element 11, surfaces of the flattening film 13 and the color filter layer 14 are flattened while the color filter layer 14 is formed, and it is thereby possible to suppress application unevenness generated when the on-chip lens layer 15 is formed on a surface thereof. This makes it possible to form a lens of the on-chip lens layer 15 in a uniform shape, and to improve the quality of the solid-state imaging element 11. Therefore, it is possible to avoid generation of nonuniformity of brightness for each pixel of an image imaged by the solid-state imaging element 11 (for each lens of the on-chip lens layer 15), and to improve image quality.

Method for Manufacturing Solid-State Imaging Element

Next, a method for manufacturing the solid-state imaging element 11 will be described with reference to FIGS. 2 and 3.

Figure 2:
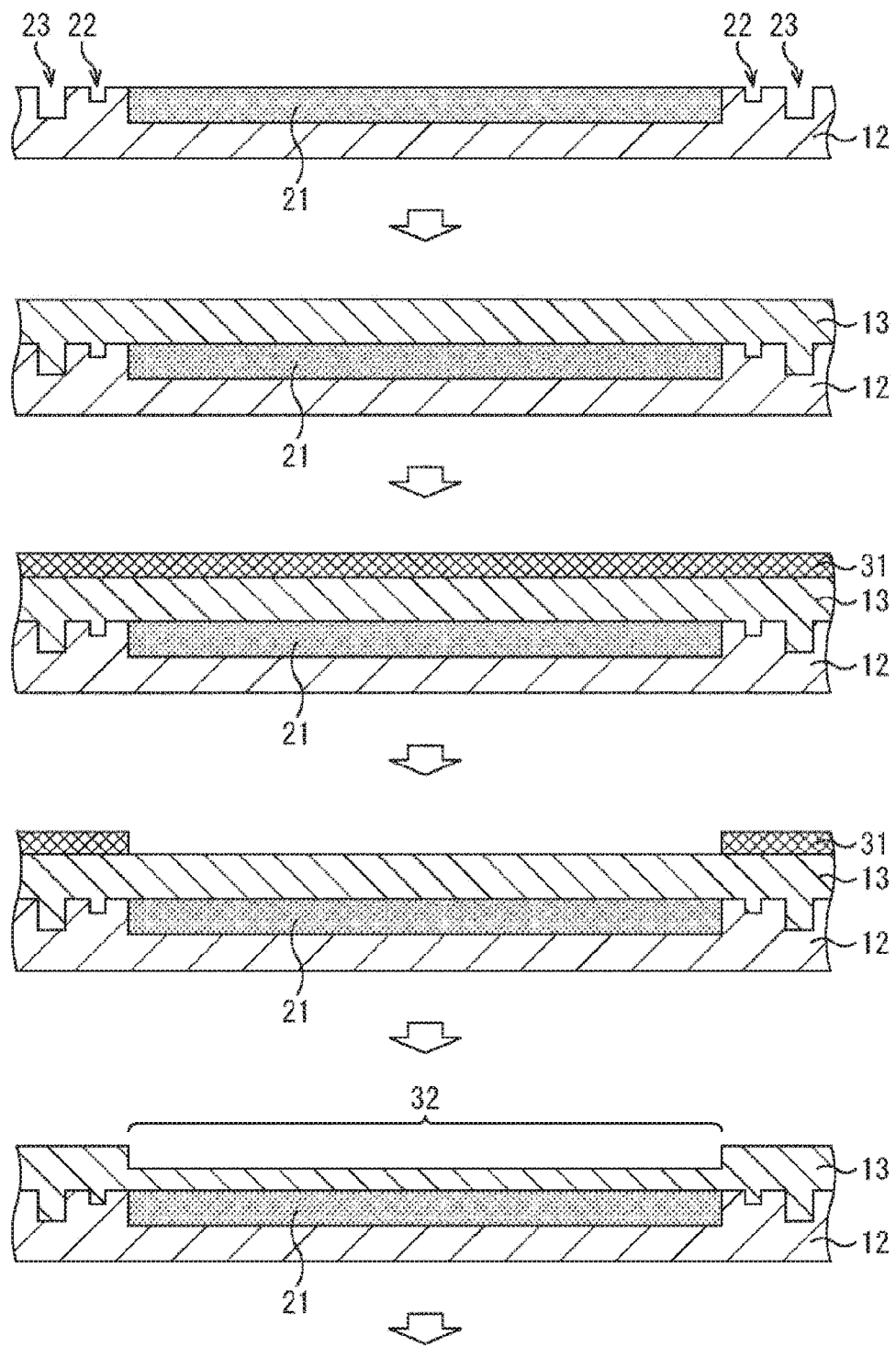
FIG. 2 is a diagram for explaining a method for manufacturing a solid-state imaging element.

First, in a first step, as illustrated in the first row of FIG. 2, for example, by implanting N-type impurity ions into the P-type semiconductor substrate 12 to form a photodiode for each pixel, the pixel region 21 is formed in the semiconductor substrate 12. In addition, in a peripheral region around a portion where the pixel region 21 of the semiconductor substrate 12 is formed, a recessed groove 22, for example, used for an alignment mark or the like, and a recessed scribe line 23 serving as a boundary when the solid-state imaging element 11 is divided into individual pieces are formed. Note that a plurality of the solid-state imaging elements 11 can be simultaneously manufactured on one semiconductor wafer, and is divided into individual pieces in a later step.

Then, in a second step, as illustrated in the second row of FIG. 2, a material to be the flattening film 13 is applied onto the semiconductor substrate 12 by a spin coating method, and a surface of the flattening film 13 is flattened. At this time, the flattening film 13 is formed so as to fill the groove 22 and the scribe line 23.

In addition, in a third step, as illustrated in the third row of FIG. 2, a photoresist 31 is applied onto the flattening film 13.

Thereafter, in a fourth step, as illustrated in the fourth row of FIG. 2, an exposure and development treatment is performed from above the photoresist 31 to remove a part, and an opening that opens corresponding to a region where the color filter layer 14 is to be formed in a later step is formed in the photoresist 31. That is, the exposure and development treatment is performed so as to leave the photoresist 31 in a portion other than the region where the color filter layer 14 is to be formed.

Then, in a fifth step, by etching the flattening film 13 by a required amount (depth) using an etching apparatus, a part of the flattening film 13 corresponding to the opening of the photoresist 31 is removed. Thereafter, by removing the photoresist 31, as illustrated in the fifth row of FIG. 2, a surface of the flattening film 13 is hollowed out, and the recessed region 32 to be filled with the color filter layer 14 is formed corresponding to the pixel region 21 of the semiconductor substrate 12.

Figure 3:
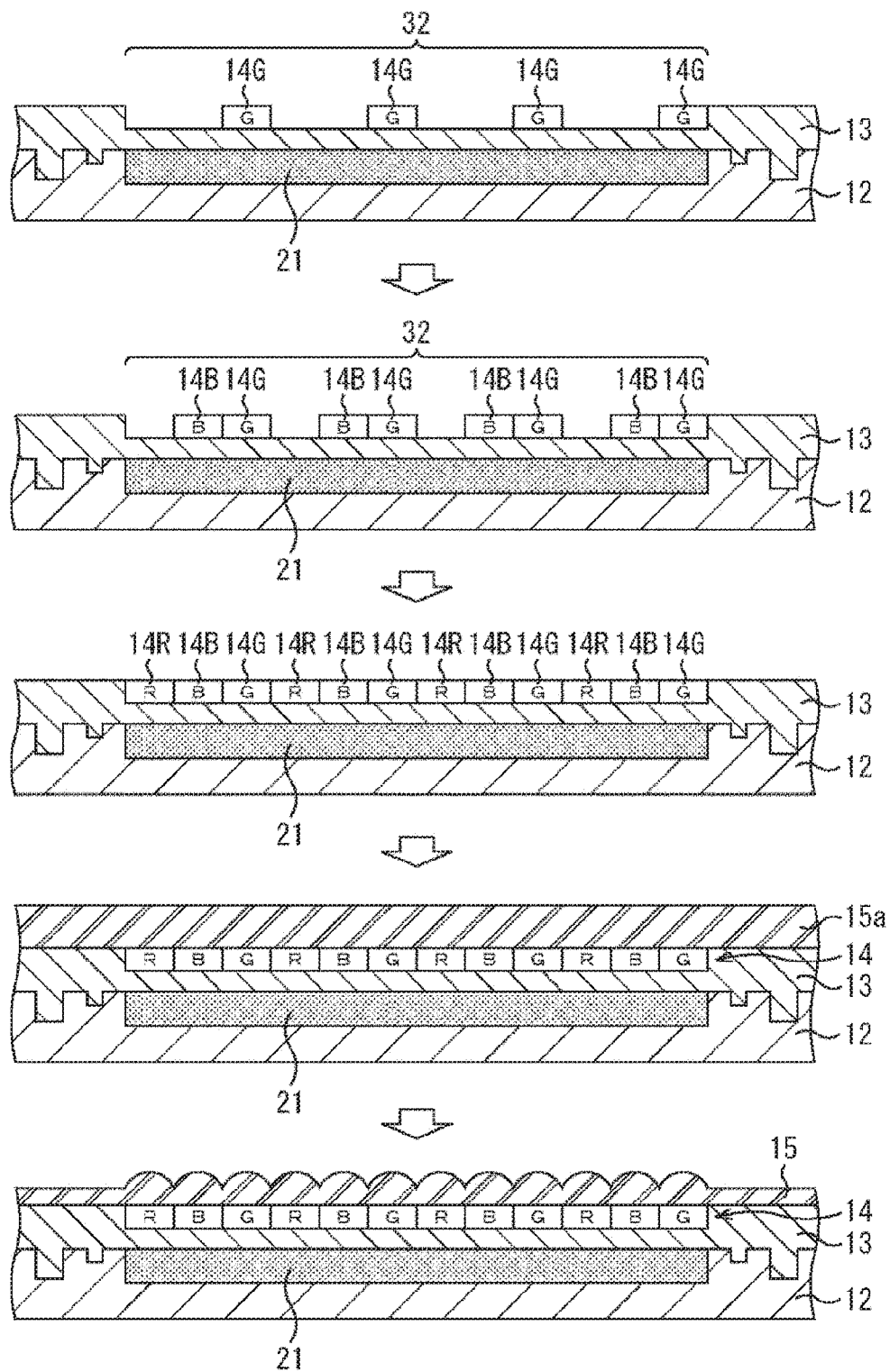
FIG. 3 is a diagram for explaining a method for manufacturing a solid-state imaging element.

Next, in a sixth step, as illustrated in the first row of FIG. 3, a pattern of a green filter 14G constituting the color filter layer 14 is formed in the recessed region 32 formed in the flattening film 13. For example, a green color filter resist (generally, a negative type photosensitive resin) is applied by a spin coating method, is dried, and then is exposed to light using a mask capable of ultraviolet irradiation, and a pattern of the green filter 14G is formed using a dedicated developing solution.

Then, in a seventh step, as illustrated in the second row of FIG. 3, a pattern of a blue filter 14B constituting the color filter layer 14 is formed in the recessed region 32 formed in the flattening film 13. For example, a blue color filter resist is applied by a spin coating method, is dried, and then is exposed to light using a mask capable of ultraviolet irradiation, and a pattern of the blue filter 14B is formed using a dedicated developing solution.

Subsequently, in an eighth step, as illustrated in the third row of FIG. 3, a pattern of a red filter 14R constituting the color filter layer 14 is formed in the recessed region 32 formed in the flattening film 13. For example, a red color filter resist is applied by a spin coating method, is dried, and then is exposed to light using a mask capable of ultraviolet irradiation, and a pattern of the red filter 14R is formed using a dedicated developing solution. As a result, the color filter layer 14 including the green filter 14G, the blue filter 14B, and the red filter 14R is formed in the recessed region 32.

In addition, in a ninth step, as illustrated in the fourth row of FIG. 3, a lens material 15a containing a transparent resin is applied onto surfaces of the flattening film 13 and the color filter layer 14 by a spin coating method.

Then, in a tenth step, by forming a lens pattern for each pixel with respect to the lens material 15a, the on-chip lens layer 15 is formed as illustrated in the fifth row of FIG. 3.

Thereafter, by cutting a wafer along the scribe line 23, for example, using a dicing blade, the solid-state imaging element 11 which has been divided into individual pieces is manufactured.

In the solid-state imaging element 11 manufactured through the above steps, the color filter layer 14 is formed in the recessed region 32 formed in the flattening film 13 according to the pixel region 21, and it is thereby possible to suppress application unevenness generated when a color filter resist is applied by a spin coating method. In addition, the on-chip lens layer 15 is formed on a flat surface including the flattening film 13 and the color filter layer 14, and it is thereby possible to suppress application unevenness generated when the lens material 15a is applied by a spin coating method.

Here, a configuration of a conventional solid-state imaging element will be described with reference to FIGS. 4A and 4B.

Figure 4A:
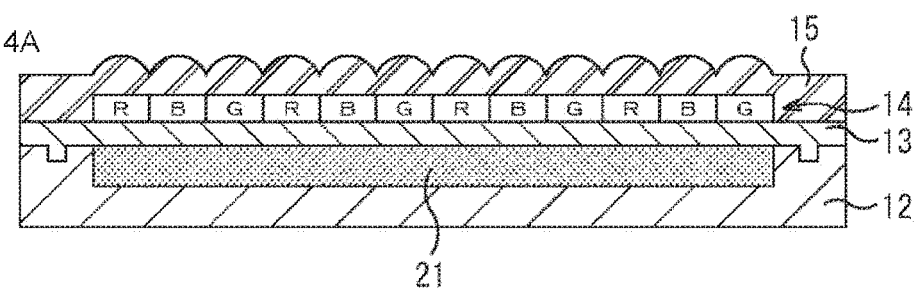
FIGS. 4A and 4B are diagrams illustrating a configuration example of a conventional solid-state imaging element.

FIG. 4A illustrates a cross-sectional configuration example of a conventional solid-state imaging element 11A. FIG. 4B illustrates a step of manufacturing the color filter layer 14 of the solid-state imaging element 11A.

Figure 4B:
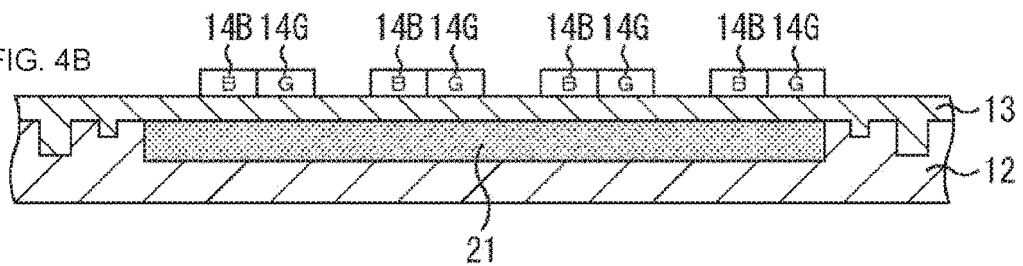

As illustrated in FIGS. 4A and 4B, in the solid-state imaging element 11A, a surface of the flattening film 13 is formed so as to be flat on the semiconductor substrate 12 where the pixel region 21 is formed, the color filter layer 14 is formed on the surface of the flattening film 13, and the on-chip lens layer 15 is laminated thereon. That is, in the solid-state imaging element 11 of FIGS. 1A and 1B, the color filter layer 14 is formed so as to fill the recessed region 32 (refer to FIG. 2) hollowed out in the flattening film 13. Meanwhile, in the solid-state imaging element 11A, the color filter layer 14 is formed on the flattening film 13. Due to such a difference in configuration, in the solid-state imaging element 11A, application unevenness may be generated in the color filter resist when the color filter layer 14 is formed.

In other words, as illustrated in FIG. 4B, in a step of applying a red color filter resist forming the red filter 14R, the green filter 14G and the blue filter 14B are formed so as to have a protruded shape on the flattening film 13. At this time, due to a level difference formed such that the green filter 14G and the blue filter 14B protrude from the flattening film 13, application unevenness is generated in the red color filter resist.

Incidentally, also in a step of applying a blue color filter resist forming the blue filter 14B, similarly, due to the green filter 14G formed in a protruded shape on the flattening film 13, application unevenness is generated in the blue color filter resist.

For example, in a spin coating method, as illustrated in FIG. 5, a semiconductor wafer 51 is rotated at a high speed around a center point of the semiconductor wafer 51 on which a plurality of the solid-state imaging elements 11A is formed, and a color filter resist (photosensitive organic material) is applied onto the center of the semiconductor wafer 51. Then, the color filter resist expands due to a centrifugal force caused by the rotation, and is thereby applied onto the entire surface of the semiconductor wafer 51 with a uniform thickness.

At this time, if the green filter 14G and the blue filter 14B are formed so as to have a protruded shape on the flattening film 13, due to a high level difference thereof, such application unevenness as indicated by a broken line is generated from the center of the semiconductor wafer 51 toward an outside thereof.

Meanwhile, in the solid-state imaging element 11, as illustrated in the above FIG. 3, in the eighth step of applying a red color filter resist forming the red filter 14R, a portion where the red filter 14R is formed has a recessed shape with respect to the flattening film 13. Therefore, unlike the situation where the green filter 14G and the blue filter 14B are formed in a protruded shape on the flattening film 13, it is possible to suppress an influence of a level difference when the red color filter resist is formed.

Incidentally, in the solid-state imaging element 11, also in a step of applying a blue color filter resist forming the blue filter 14B, a portion where the blue filter 14B is formed has a recessed shape with respect to the flattening film 13, and therefore it is possible to suppress an influence of a level difference thereof.

As described above, the solid-state imaging element 11 can suppress application unevenness generated in a color filter resist when the color filter layer 14 is formed due to a difference in structure between the solid-state imaging element 11 and the solid-state imaging element 11A.

Furthermore, the solid-state imaging element 11 can suppress application unevenness generated when the lens material 15a of the on-chip lens layer 15 is applied.

A step of applying the lens material 15a in the conventional solid-state imaging element 11A will be described with reference to FIG. 6.

As illustrated in FIG. 4A, in the solid-state imaging element 11A, the color filter layer 14 is formed on a surface of the flat flattening film 13, and therefore as illustrated in the upper side of FIG. 6, a level difference is formed at an end portion (portion surrounded by a broken line) of the color filter layer 14. For this reason, as illustrated in the lower side of FIG. 6, when the lens material 15a is applied by a spin coating method, application unevenness is generated due to the level difference at the end portion of the color filter layer 14.

Meanwhile, in the solid-state imaging element 11 of FIGS. 1A and 1B, as illustrated in the above FIG. 3, surfaces of the flattening film 13 and the color filter layer 14 are formed so as to be flat, and therefore it is possible to suppress application unevenness generated when the lens material 15a is applied. Therefore, the lens material 15a is formed with a uniform thickness, and therefore it is possible to form a lens of the on-chip lens layer 15 formed using the lens material 15a in a uniform shape with high accuracy.

Modification Example of Method for Manufacturing Solid-state Imaging Element

Next, a modification example of the method for manufacturing the solid-state imaging element 11 will be described with reference to FIG. 7.

Figure 7:
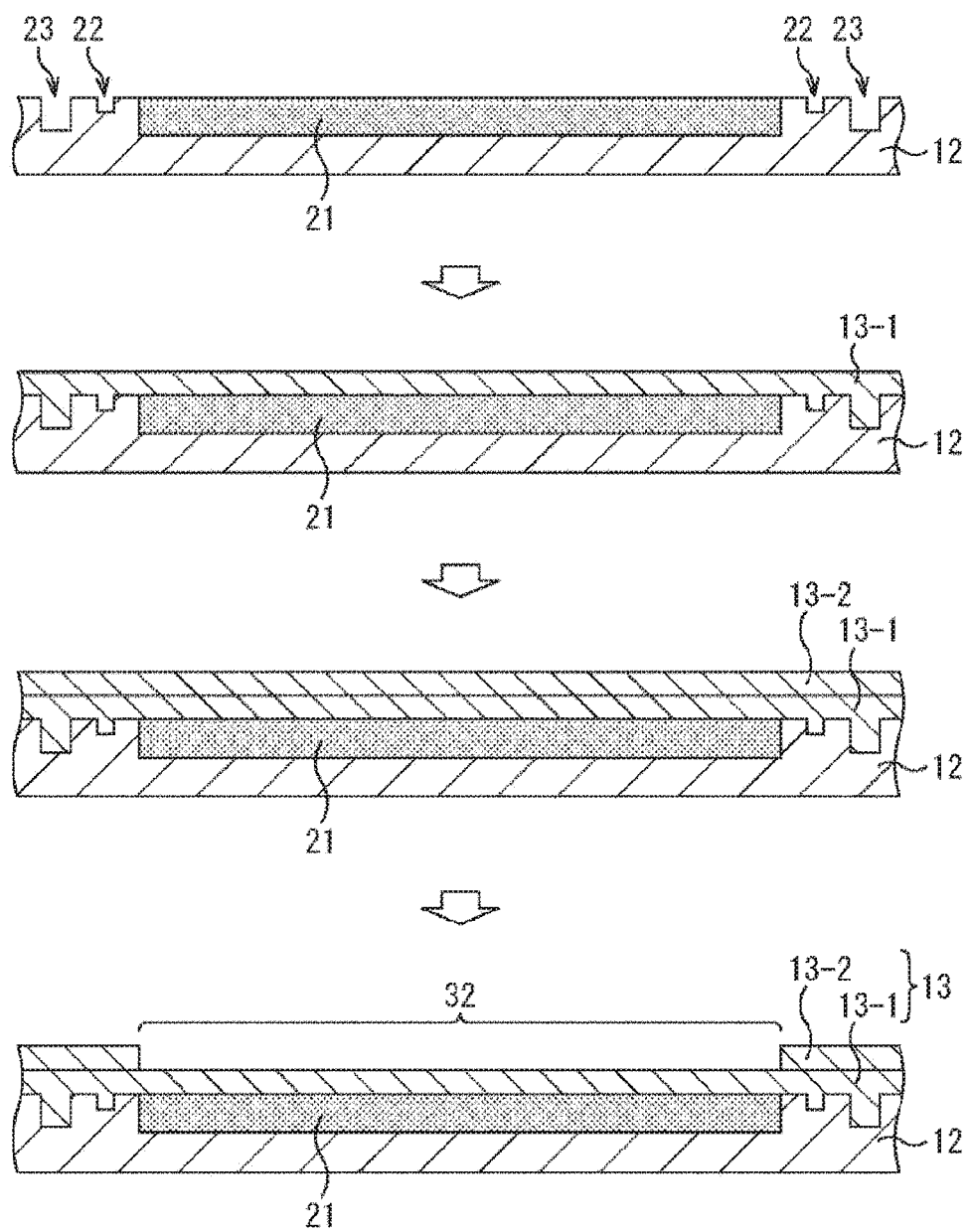
FIG. 7 is a diagram for explaining a modification example of a method for manufacturing a solid-state imaging element.

First, in a twenty first step, as illustrated in the first row of FIG. 7, the pixel region 21 is formed in the semiconductor substrate 12 in a similar manner to the above first step (FIG. 2).

Then, in a twenty second step, as illustrated in the second row of FIG. 7, a resin to be a first flattening film 13-1 is applied onto the semiconductor substrate 12 by a spin coating method, and a surface of the first flattening film 13-1 is flattened. Here, the first flattening film 13-1 is formed so as to have a thickness thinner than the thickness of the flattening film 13 of FIGS. 1A and 1B and equal to the remaining thickness of a portion where the recessed region 32 is formed in the flattening film 13. In addition, a resin having no photosensitivity is used for the first flattening film 13-1.

In addition, in a twenty third step, as illustrated in the third row of FIG. 7, a resin to be a second flattening film 13-2 is applied onto the first flattening film 13-1 by a spin coating method, and a surface of the second flattening film 13-2 is flattened. Here, the second flattening film 13-2 is formed with a film thickness which is the height of the color filter layer 14. In addition, a resin having photosensitivity obtained by adding a photosensitive material to a resin used as the same material as the first flattening film 13-1, is used for the second flattening film 13-2.

Then, in a twenty fourth step, as illustrated in the fourth row of FIG. 7, in order to hollow out the second flattening film 13-2 according to a region where the color filter layer 14 is formed, a development treatment is performed by performing exposure using a reticle, and a part of the second flattening film 13-2 is removed.

The second flattening film 13-2 is thereby formed outside a region corresponding to the pixel region 21, and the recessed region 32 is formed in the flattening film 13 including the first flattening film 13-1 and the second flattening film 13-2.

Thereafter, by performing similar steps to the sixth step and the following steps in FIG. 3, the color filter layer 14 and the on-chip lens layer 15 are formed to manufacture the solid-state imaging element 11. By forming the recessed region 32 in the flattening film 13 by such a manufacturing method, it is possible to suppress application unevenness generated when the color filter layer 14 and the on-chip lens layer 15 are formed similarly to the above manufacturing method.

Next, a configuration of a peripheral portion of the color filter layer 14 will be described with reference to FIGS. 8A, 8B, and 8C.

Figure 8A:
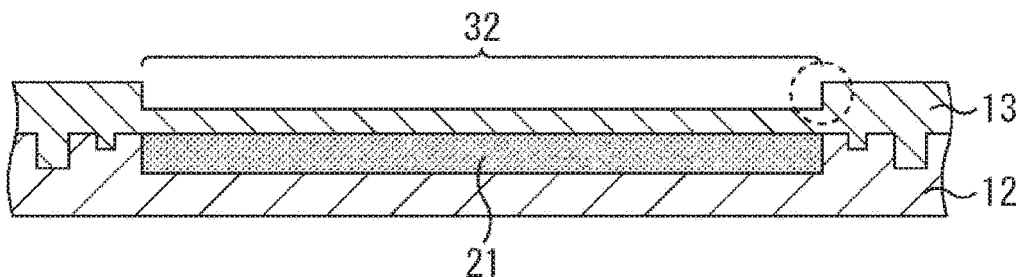
FIGS. 8A, 8B, and 8C are diagrams illustrating a configuration of a peripheral portion of a color filter layer.

FIG. 8A illustrates a cross-sectional configuration example in a state where the recessed region 32 is formed in the flattening film 13 similarly to the fifth row of FIG. 2. As illustrated in FIGS. 8A, 8B, and 8C, a level difference so as to be recessed toward a center is formed in an outer peripheral portion of the recessed region 32 of the flattening film 13 as in a portion surrounded by a broken line. Therefore, at the time of forming the color filter layer 14, application unevenness is expected to be generated around the color filter layer 14 due to an influence of the level difference in the recessed region 32.

Figure 8B:
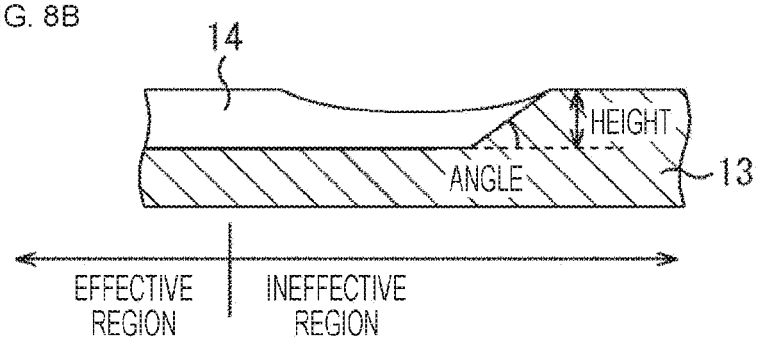

Therefore, in the solid-state imaging element 11, in order to suppress an influence of a level difference of the recessed region 32 at the time of forming the color filter layer 14, as illustrated in FIG. 8B, a tapered surface inclined at a predetermined angle according to the height (depth) of the recessed region 32 is formed in an outer peripheral portion of the recessed region 32. As a result, it is possible to suppress an influence of a level difference of the recessed region 32 when a color filter resist is applied, and to limit a range where application unevenness is generated in the color filter resist.

For example, an ineffective region is disposed outside an effective region in which a function as the color filter layer 14 is effective, and the angle of the tapered surface in the outer peripheral portion of the recessed region 32 is set such that a range in which application unevenness is generated in the color filter resist falls within the ineffective region. As a result, in the effective region of the color filter layer 14, it is possible to apply the color filter resist with a uniform thickness, and to avoid a bad influence on image quality by application unevenness.

Figure 8C:
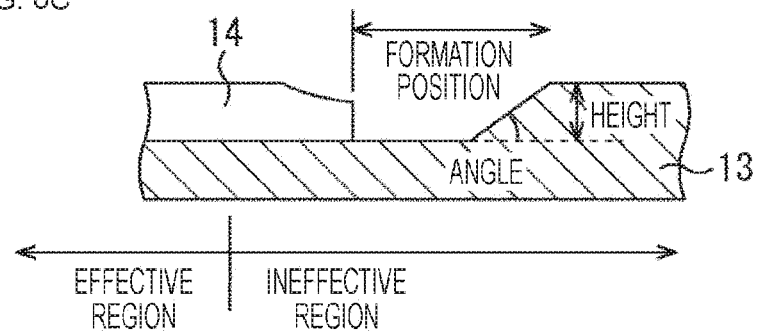

Furthermore, as illustrated in FIG. 8C, a formation position of the color filter layer 14 is set so as to have a predetermined interval from the outer peripheral portion of the recessed region 32 such that an end portion of the color filter layer 14 is disposed in the ineffective region. In this way, also by adjusting the formation position such that the color filter layer 14 is formed slightly inside the recessed region 32, it is possible to suppress an influence of a level difference of the recessed region 32 when a color filter resist is applied.

As described above, in the solid-state imaging element 11, for example, by appropriately setting process conditions for forming the recessed region 32, it is possible to form a tapered surface in the outer peripheral portion of the recessed region 32, and to limit a range where application unevenness is generated in the color filter resist within the ineffective region. As a result, in the solid-state imaging element 11, the color filter layer 14 in the effective region can be formed with a uniform thickness, and quality can be improved.

Note that the step of forming the recessed region 32 in the solid-state imaging element 11 is not limited to the method described above with reference to FIGS. 2 and 7, but various other methods can be adopted.

Configuration Example of Electronic Device

Note that the solid-state imaging element 11 of such an embodiment as described above can be applied to various electronic devices such as an imaging system including a digital still camera, a digital video camera, and the like, a mobile phone having an imaging function, or another device having an imaging function.

Figure 9:
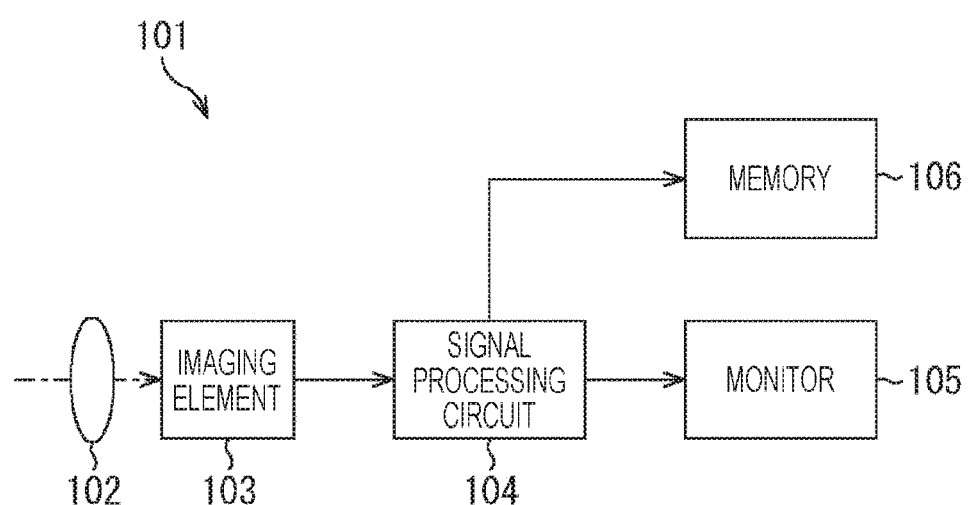
FIG. 9 is a block diagram illustrating a configuration example of an embodiment of an electronic device to which the present technology is applied.

FIG. 9 is a block diagram illustrating a configuration example of an imaging apparatus mounted on an electronic device.

As illustrated in FIG. 9, an imaging apparatus 101 includes an optical system 102, an imaging element 103, a signal processing circuit 104, a monitor 105, and a memory 106, and can image a still image and a moving image.

The optical system 102 includes one or more lenses, and guides image light (incident light) from a subject to the imaging element 103 to form an image on a light receiving surface (sensor portion) of the imaging element 103.

The solid-state imaging element 11 of the above embodiment is applied to the imaging element 103. In the imaging element 103, electrons are accumulated for a certain period of time according to an image formed on the light receiving surface via the optical system 102. Then, a signal corresponding to the electrons accumulated in the imaging element 103 is supplied to the signal processing circuit 104.

The signal processing circuit 104 performs various types of signal processing on a pixel signal output from the imaging element 103. An image (image data) obtained by performing signal processing by the signal processing circuit 104 is supplied to the monitor 105 to be displayed, or supplied to the memory 106 to be stored (recorded).

In the imaging apparatus 101 having such a configuration, by applying the solid-state imaging element 11 of the above embodiment, for example, it is possible to image an image with uniform brightness and good image quality.

Use Example of Image Sensor

Figure 10:
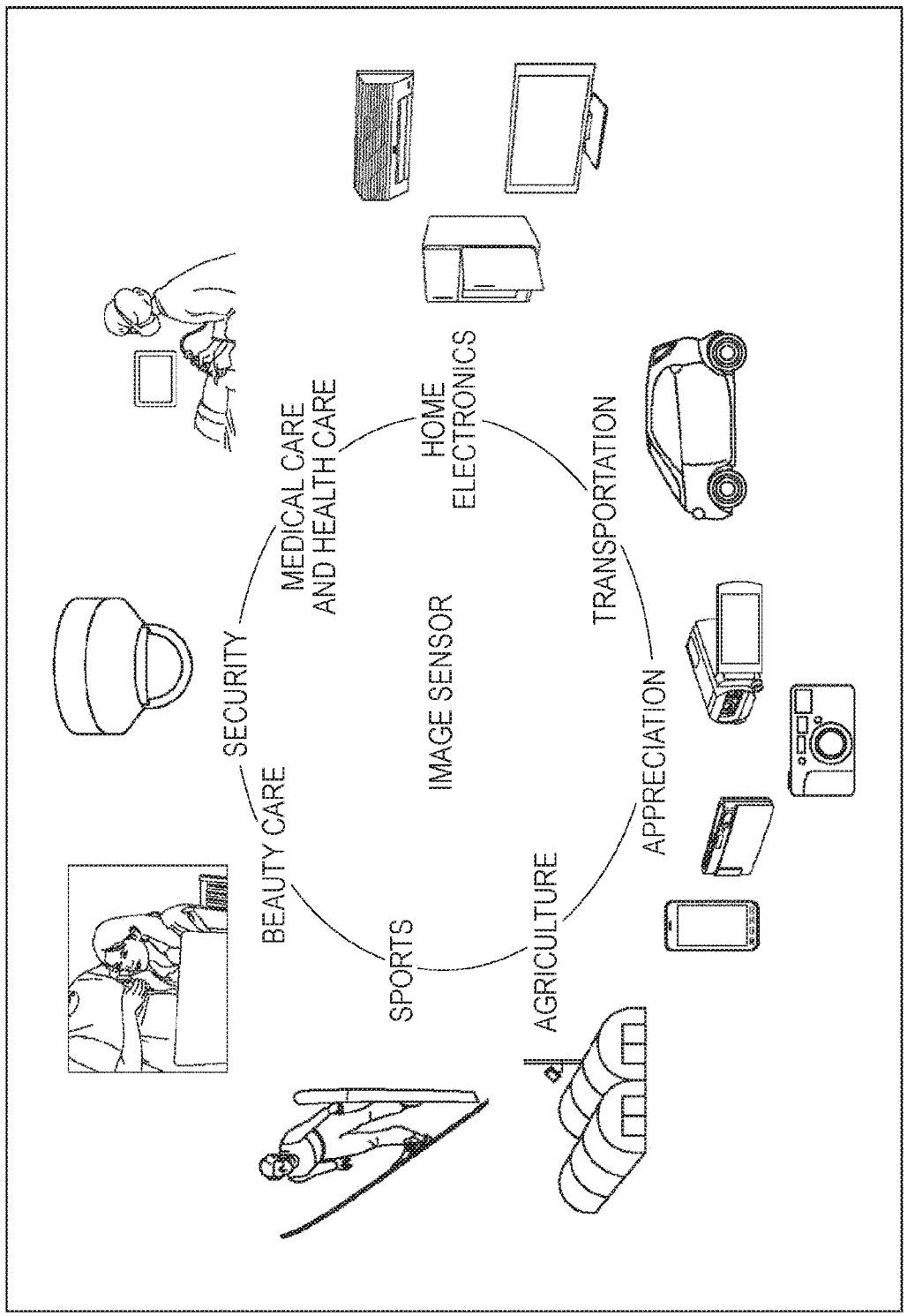
FIG. 10 is a diagram illustrating a use example of using an image sensor.

FIG. 10 is a diagram illustrating a use example of using the above image sensor (solid-state imaging element 11).

The above image sensor can be used, for example, in various cases of sensing light such as visible light, infrared light, ultraviolet light, or an X-ray as described below.

An apparatus for imaging an image used for appreciation, such as a digital camera or a portable device with a camera function A device used for transportation, such as a vehicle-mounted sensor for imaging the front, the back, the surrounding, the inside, or the like of an automobile for safe driving such as automatic stop, for recognition of a driver's condition, and the like, a surveillance camera for monitoring a running vehicle and a road, or a measuring sensor for measuring a distance between vehicles or the like An apparatus used for home electronics, such as a television set, a refrigerator, or an air conditioner for imaging a gesture of a user and operating a device according to the gesture An apparatus used for medical care and health care, such as an endoscope or an apparatus for receiving infrared light for angiography An apparatus used for security, such as a surveillance camera for crime prevention or a camera for personal authentication An apparatus used for beauty care, such as a skin measurement device for imaging a skin or a microscope for imaging a scalp An apparatus used for sports, such as an action camera or a wearable camera for sports and the like An apparatus used for agriculture, such as a camera for monitoring a condition of a field and a crop Note that the present technology can have the following configurations.

(1) A solid-state imaging element including:
a semiconductor substrate having a pixel region in which a plurality of pixels is arranged in an array;
a flattening film formed so as to fill a recessed portion of the semiconductor substrate; and
a color filter layer formed in a recessed region formed in the flattening film corresponding to the pixel region.

(2) The solid-state imaging element according to (1), in which
the recessed region is formed by forming the flattening film and then hollowing out a region corresponding to the pixel region of the flattening film according to the thickness of the color filter layer.

(3) The solid-state imaging element according to (1), in which
the recessed region is formed by forming a first flattening film so as to be flat with a predetermined thickness and forming a second flattening film outside a region corresponding to the pixel region with respect to the first flattening film.

(4) The solid-state imaging element according to anyone of (1) to (3), further including
an on-chip lens layer formed on a plane including the flattening film and the color filter layer.

(5) The solid-state imaging element according to anyone of (1) to (4), in which
a tapered surface is formed in an outer peripheral portion of the recessed region.

(6) A solid-state imaging element according to any one of (1) to (5), in which
the color filter layer is formed at a formation position where an end portion of the color filter layer is disposed in an ineffective region disposed outside an effective region which is a region where a function as the color filter layer is effective.

(7) A method for manufacturing a solid-state imaging element, the method including:
forming a flattening film so as to fill a recessed portion of a semiconductor substrate having a pixel region in which a plurality of pixels is arranged in an array; and
forming a color filter layer in a recessed region formed in the flattening film corresponding to the pixel region.

(8) An electronic device including a solid-state imaging element including:
a semiconductor substrate having a pixel region in which a plurality of pixels is arranged in an array;
a flattening film formed so as to fill a recessed portion of the semiconductor substrate; and
a color filter layer formed in a recessed region formed in the flattening film corresponding to the pixel region.

Note that the present embodiment is not limited to the above embodiment, and various modifications can be made thereto without departing from the gist of the present disclosure.

REFERENCE SIGNS LIST

11 Solid-state imaging element
12 Semiconductor substrate
13 Flattening film
14 Color filter layer
14G Green filter
14B Blue filter
14R Red filter
15 On-chip lens layer
21 Pixel region
22 Groove
23 Scribe line
31 Photoresist
32 Recessed region
51 Semiconductor wafer

The invention claimed is:

1. A solid-state imaging element, comprising:
a semiconductor substrate that comprises a pixel region, wherein the pixel region comprises a plurality of pixels in an array;
a flattening film that fills a recessed portion of the semiconductor substrate, wherein
the flattening film includes a recessed region, and
an outer peripheral portion of the recessed region includes a tapered surface;
a color filter layer in the recessed region of the flattening film, wherein
the color filter layer corresponds to the pixel region,
a portion of the flattening film is between the semiconductor substrate and the color filter layer, and
a length of the portion of the flattening film is smaller than a length of the flattening film; and
an on-chip lens layer, wherein a surface of the on-chip lens layer is coincident with each of a surface of the flattening film and a surface of the color filter layer.

2. The solid-state imaging element according to claim 1, wherein
the flattening film includes:
a first flattening film; and
a second flattening film on the first flattening film,
the first flattening film is flat and has a specific thickness,
the recessed region is in the second flattening film, and
the recessed region corresponds to the pixel region.

3. The solid-state imaging element according to claim 1, wherein
the color filter layer is at a formation position where an end portion of the color filter layer is in an ineffective region, and
the ineffective region is outside of an effective region which is a region where a function as the color filter layer is effective.

4. A method for manufacturing a solid-state imaging element, the method comprising:
forming a flattening film to fill a recessed portion of a semiconductor substrate having a pixel region in which a plurality of pixels is in an array;
forming a recessed region in the flattening film, wherein an outer peripheral portion of the recessed region includes a tapered surface;
forming a color filter layer in the recessed region of the flattening film, wherein
the color filter layer corresponds to the pixel region,
a portion of the flattening film is formed between the semiconductor substrate and the color filter layer, and
a length of the portion of the flattening film is smaller than a length of the flattening film; and
an on-chip lens layer, wherein a surface of the on-chip lens layer is coincident with each of a surface of the flattening film and a surface of the color filter layer.

5. An electronic device, comprising:
a solid-state imaging element including:
a semiconductor substrate that comprises a pixel region, wherein the pixel region comprises a plurality of pixels in an array;
a flattening film that fills a recessed portion of the semiconductor substrate, wherein
the flattening film includes a recessed region, and
an outer peripheral portion of the recessed region includes a tapered surface;
a color filter layer in the recessed region of the flattening film, wherein
the color filter layer corresponds to the pixel region,
a portion of the flattening film is between the semiconductor substrate and the color filter layer, and
a length of the portion of the flattening film is smaller than a length of the flattening film; and
an on-chip lens layer, wherein a surface of the on-chip lens layer is coincident with each of a surface of the flattening film and a surface of the color filter layer.

6. A solid-state imaging element, comprising:
a semiconductor substrate that comprises a pixel region, wherein the pixel region comprises a plurality of pixels in an array;
a flattening film that fills a recessed portion of the semiconductor substrate, wherein
the flattening film includes a recessed region, and
an outer peripheral portion of the recessed region includes a tapered surface;
a color filter layer in the recessed region of the flattening film, wherein the color filter layer corresponds to the pixel region; and
an on-chip lens layer, wherein a surface of the on-chip lens layer is coincident with each of a surface of the flattening film and a surface of the color filter layer.

7. The method according to claim 4, further comprising hollowing out a region of the flattening film based on a thickness of the color filter layer, wherein the region of the flattening film corresponds to the pixel region.

8. The method according to claim 4, further comprising:
forming the recessed region by forming a first flattening film that is flat and has a specific thickness; and
forming a second flattening film outside a region corresponding to the pixel region.

9. A solid-state imaging element, comprising:
a semiconductor substrate that comprises a pixel region, wherein the pixel region comprises a plurality of pixels in an array;
a flattening film that fills a recessed portion of the semiconductor substrate, wherein the flattening film includes a recessed region;
a color filter layer in the recessed region of the flattening film, wherein
the color filter layer corresponds to the pixel region,
the color filter layer is at a formation position where an end portion of the color filter layer is in an ineffective region,
the ineffective region is outside of an effective region which is a region where a function as the color filter layer is effective,
a portion of the flattening film is between the semiconductor substrate and the color filter layer, and
a length of the portion of the flattening film is smaller than a length of the flattening film; and
an on-chip lens layer, wherein a surface of the on-chip lens layer is coincident with each of a surface of the flattening film and a surface of the color filter layer.

* * * * *